(12) United States Patent
Hsin et al.

(10) Patent No.: US 8,445,992 B2
(45) Date of Patent: May 21, 2013

(54) LATERAL AVALANCHE PHOTODIODE STRUCTURE

(75) Inventors: Yue-Ming Hsin, Tainan (TW);
Fang-Ping Chou, New Taipei (TW);
Zi-Ying Li, New Taipei (TW);
Ching-Wen Wang, Changhua County (TW)

(73) Assignee: National Central University, Taoyuan (TW)

( * ) Notice: Subject to any disclaimer, the term of this patent is extended or adjusted under 35 U.S.C. 154(b) by 15 days.

(21) Appl. No.: 13/239,396

(22) Filed: Sep. 22, 2011

(65) Prior Publication Data
US 2013/0026604 A1 Jan. 31, 2013

(30) Foreign Application Priority Data
Jul. 26, 2011 (TW) .............................. 100126410 A (51) Int. Cl.
*H01L 29/861* (2006.01)
(52) U.S. Cl.
USPC .................................. 257/603; 257/E29.335

(58) Field of Classification Search
USPC ........................................... 257/603, E29.335
See application file for complete search history.

(56) References Cited

U.S. PATENT DOCUMENTS

| | | | | |
|---|---|---|---|---|
| 5,179,431 | A * | 1/1993 | Shirai | 257/187 |
| 5,929,502 | A * | 7/1999 | Beasom | 257/497 |
| 8,178,886 | B2 * | 5/2012 | Horng | 257/88 |
| 2010/0245809 | A1 * | 9/2010 | Andreou et al. | 356/222 |
| 2010/0271108 | A1 * | 10/2010 | Sanfilippo et al. | 327/502 |
| 2011/0272561 | A1 * | 11/2011 | Sanfilippo et al. | 250/214.1 |
| 2012/0001202 | A1 * | 1/2012 | Horng | 257/88 |

* cited by examiner

*Primary Examiner* — Lex Malsawma
(74) *Attorney, Agent, or Firm* — Jianq Chyun IP Office (57) ABSTRACT

A lateral avalanche photodiode structure including a substrate, a PN diode and a metal layer is provided. The substrate has at least one first electrode area, at least one light receiving area, and at least one second electrode area which are arranged horizontally. The first electrode area is also an avalanche area, and the light receiving area is between the first electrode area and the second electrode area. The PN diode is disposed in the substrate in the first electrode area. The metal layer is disposed on the substrate and covers the first electrode area and the second electrode area, but does not cover the light receiving area.

21 Claims, 7 Drawing Sheets

FIG. 9

LATERAL AVALANCHE PHOTODIODE STRUCTURE

CROSS-REFERENCE TO RELATED APPLICATION

This application claims the priority benefit of Taiwan application serial no. 100126410, filed on Jul. 26, 2011. The entirety of the above-mentioned patent application is hereby incorporated by reference herein and made a part of this specification.

BACKGROUND OF THE INVENTION

1. Field of Invention

The present invention relates to a semiconductor device, and more generally to a lateral avalanche photodiode (APD) structure.

2. Description of Related Art

An avalanche photodiode is widely applied in optical communication due to the high speed and internal gain thereof. A conventional avalanche photodiode has a vertical structure, and the dopant concentration of each layer can be directly designed to obtain the optimal avalanche result. However, the method of forming such vertical avalanche photodiode cannot be integrated with the current commercial process (e.g. CMOS process). Therefore, the applicability is significantly limited.

Nowadays, the avalanche photodiode fabricated by a CMOS process becomes popular in the application of optical communication at near-infrared wavelengths (e.g. 850 nm) due to its low cost and possible integration with receivers. However, the light penetration depth of silicon material at 850 nm is greater than 10 μm, resulting in low responsivity of the avalanche photodiode. Moreover, carriers generated from the silicon substrate slowly diffuse to be collected and greatly affect the response performance.

Figure 1:
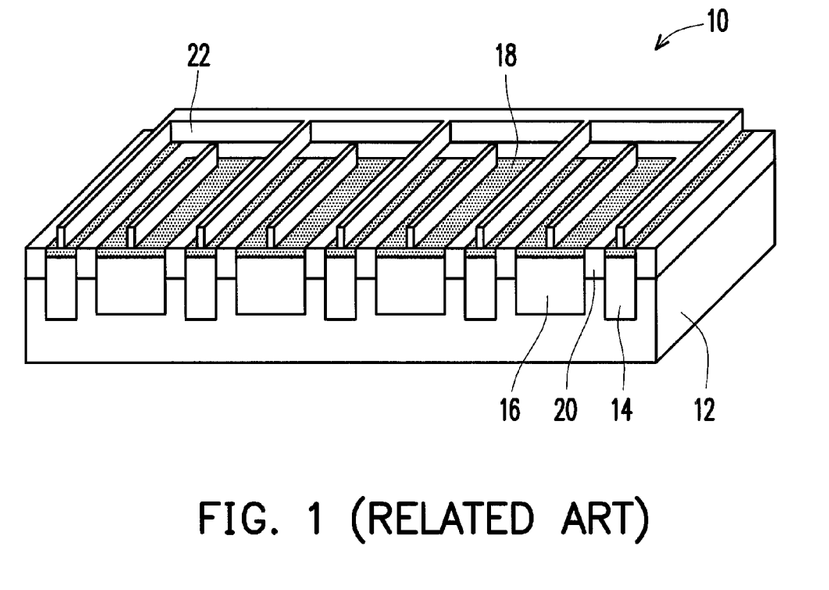
FIG. 1 schematically illustrates a partial perspective view of a conventional avalanche photodiode structure.

FIG. 1 schematically illustrates a partial perspective view of a conventional avalanche photodiode structure fabricated by a CMOS process. A conventional avalanche photodiode structure 10 includes a P-type substrate 12, a plurality of P-type well regions 14, a plurality of N-type well regions 16, a plurality of S/D doped regions 18, a plurality of shallow trench isolation (STI) structures 20 and an electrode layer 22. The P-type well regions 14 and the N-type well regions 16 are arranged alternately and separated from each other by the STI structures 20. The S/D doped regions 18 are disposed in the P-type well regions 14 and the N-type well regions 16. The electrode layer 22 is disposed on the P-type substrate 12 and electronically connected to the P-type well regions 14 and the N-type well regions 16. However, in the conventional avalanche photodiode structure 10, a reverse bias is applied to PN diodes, and the PN diodes are operated at the breakdown regions. In other words, the conventional avalanche photodiode structure 10 is not like a typical avalanche photodiode including an avalanche area and a light receiving area, so that the response speed and bandwidth thereof cannot meet the customer's requirements.

SUMMARY OF THE INVENTION

Accordingly, the present invention provides a lateral APD structure, in which the avalanche area and the light receiving area are separated by the metal layer, so that the response speed and bandwidth can be significantly improved, and the device performance can be effectively enhanced.

The present invention provides a lateral APD structure including a substrate of a first conductivity type, a PN diode and a metal layer. The substrate has at least one first electrode area, at least one light receiving area and at least one second electrode area arranged horizontally, wherein the first electrode area is an avalanche area, and the light receiving area is disposed between the first electrode area and the second electrode area. The PN diode is disposed in the substrate in the first electrode area. The metal layer is disposed on the substrate and covers the first electrode area and the second electrode area, but does not cover the light receiving area.

According to an embodiment of the present invention, the lateral avalanche photodiode structure further includes a plurality of isolation structures disposed in the substrate, wherein the first electrode area, the light receiving area and the second electrode area are separated from each other by the isolation structures.

According to an embodiment of the present invention, the lateral avalanche photodiode structure further includes a well region of the first conductivity type, a first doped region of a second conductivity type and a second doped region of the first conductivity type. The well region is disposed in the substrate in the first electrode area. The first doped region is disposed in the well region in the first electrode area, wherein the well region and the first doped region forms the PN diode. The second doped region is disposed in the substrate in the second electrode.

According to an embodiment of the present invention, the first conductivity type is P-type and the second conductivity type is N-type, or the first conductivity type is N-type and the second conductivity type is P-type.

According to an embodiment of the present invention, the lateral avalanche photodiode structure further includes a well region of a second conductivity type, a first doped region of the first conductivity type and a second doped region of the second conductivity type. The well region is disposed in the substrate in the first electrode area, the light receiving area and the second electrode area. The first doped region is disposed in the well region in the first electrode area, wherein the well region and the first doped region forms the PN diode. The second doped region is disposed in the well region in the second electrode.

According to an embodiment of the present invention, the lateral avalanche photodiode structure further includes a deep well region of the second conductivity type disposed in the substrate in the first electrode area and located below the well region.

According to an embodiment of the present invention, the first conductivity type is P-type and the second conductivity type is N-type, or the first conductivity type is N-type and the second conductivity type is P-type.

According to an embodiment of the present invention, a material of the substrate includes silicon.

According to an embodiment of the present invention, a material of the metal layer includes copper.

According to an embodiment of the present invention, the substrate includes a plurality of first electrode areas, a plurality of light receiving areas and a plurality of second electrode areas, the first electrode areas and the second electrode areas are arranged alternately, and a light receiving area is disposed between a first electrode area and an adjacent second electrode area According to an embodiment of the present invention, ends of the first electrode areas are not connected, and ends of the second electrode areas are not connected, so as to form a plurality of lateral avalanche photodiode structures each having a stripe shape.

According to an embodiment of the present invention, ends of the first electrode areas are connected, and ends of the second electrode areas are connected, so as to form a plurality of lateral avalanche photodiode structures each having a surrounding distribution.

The present invention further provides a lateral avalanche photodiode structure includes a substrate of a first conductivity type, a PN diode, a first metal layer, an insulating layer and a second metal layer. The substrate has at least one first area, at least one light receiving area and at least one second area arranged horizontally, wherein the light receiving area is disposed between the first area and the second area, and wherein the first area is an avalanche area, the first area includes a first electrode area and two light shielding areas beside the first electrode area, and the second area is a second electrode area. The PN diode is disposed in the substrate in the first area. The first metal layer is disposed on the substrate and only covers the first electrode area and the second electrode area. The second metal layer is disposed on the first metal layer and at least covers the light shielding areas. The insulating layer is disposed between the first metal layer and the second metal layer.

According to an embodiment of the present invention, the lateral avalanche photodiode structure further includes a first well region of a second conductivity type, two second well regions of the first conductivity type and a third well region of the first conductivity type. The first well region is disposed in the substrate in the first electrode area. The two second well regions are disposed in the substrate respectively in the light shielding areas, wherein the first well region and the second well region forms the PN diode. The third well region is disposed in the substrate in the second electrode area.

According to an embodiment of the present invention, the lateral avalanche photodiode structure further includes a first doped region of the second conductivity type and a second doped region of the first conductivity type. The first doped region is disposed in the first well region in the first electrode area. The second doped region is disposed in the third well region in the second electrode area.

According to an embodiment of the present invention, the first conductivity type is P-type and the second conductivity type is N-type, or the first conductivity type is N-type and the second conductivity type is P-type.

According to an embodiment of the present invention, a material of the substrate includes silicon.

According to an embodiment of the present invention, a material of the first metal layer and the second metal layer includes copper.

According to an embodiment of the present invention, the substrate includes a plurality of first areas, a plurality of light receiving areas and a plurality of second areas, the first areas and the second areas are arranged alternately, and a light receiving area is disposed between a first area and an adjacent second area.

According to an embodiment of the present invention, ends of the first areas are not connected, and ends of the second areas are not connected, so as to form a plurality of lateral avalanche photodiode structures each having a stripe shape.

According to an embodiment of the present invention, ends of the first areas are connected, and ends of the second areas are connected, so as to form a plurality of lateral avalanche photodiode structures each having a surrounding distribution.

In view of the above, in the present invention, the metal layer is used to separate the avalanche area from the light receiving area, the irradiation region not covered with the metal layer is the APD light receiving area, and the PN junction area covered with the metal layer is the avalanche area with strong electric field. Such arrangement helps to amplify the photocurrent and increase the responsivity. Further, the lateral APD structure of the present invention can be fabricated with a standard CMOS process. Therefore, the process cost can be significantly saved, and the competitive advantage can be achieved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2:
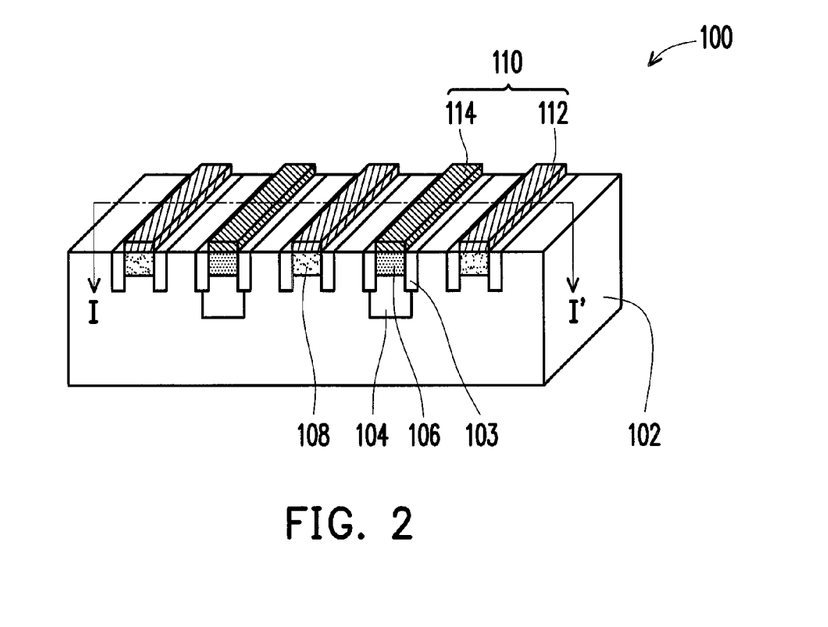
FIG. 2 schematically illustrates a partial perspective view of a lateral avalanche photodiode structure according to a first embodiment of the present invention.
Figure 3:
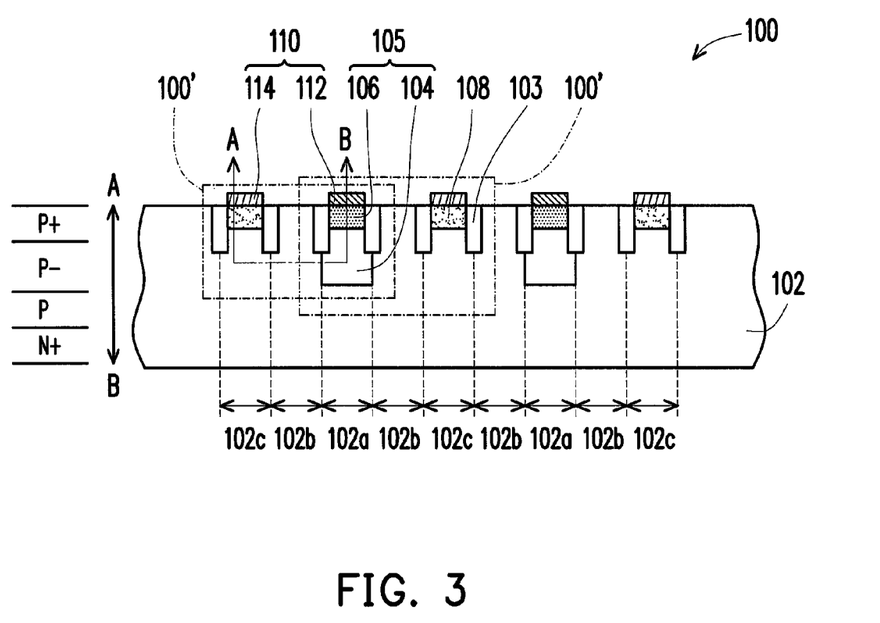
FIG. 3 schematically illustrates a cross-sectional view along the I-I' line of FIG. 2.

FIG. 2 schematically illustrates a partial perspective view of a lateral avalanche photodiode (APD) structure according to a first embodiment of the present invention. FIG. 3 schematically illustrates a cross-sectional view along the I-I' line of FIG. 2.

Referring to FIGS. 2 and 3, a lateral APD structure 100 includes a substrate 102 of a first conductivity type, a plurality of isolation structures 103, a plurality of well regions 104 of the first conductivity type, a plurality of doped regions 106 of a second conductivity type, a plurality of doped regions 108 of the first conductivity type and a metal layer 110.

The substrate 102 is a P-type lightly doped (P⁻) silicon substrate, for example. The substrate 102 has a plurality of first electrode areas 102a, a plurality of light receiving areas 102b and a plurality of second electrode areas 102c arranged horizontally. Further, the first electrode areas 102a are avalanche areas. The first electrode areas 102a and the second electrode areas 102c are arrange alternately, and a light receiving area 102b is disposed between a first electrode area 102a and an adjacent second electrode area 102c. The isolation structures 103 are shallow trench isolations (STI) structures, for example. The first electrode areas 102a, the light receiving areas 102b and the second electrodes areas 102c are separated from each other by the isolation structures 103.

The well regions 104 are P-type doped (P) well regions, for example. The well regions 104 are disposed in the substrate 102 respectively in the first electrode areas 102a. The doped regions 106 are N-type heavily doped (N⁺) regions, for example. The doped regions 106 are respectively disposed in the well regions 104 in the first electrode areas 102a. In each first electrode area 102a, the well region 104 and the doped region 106 forms a PN diode 105. The doped regions 108 are P-type heavily doped (P⁺) regions, for example. The doped regions 108 are disposed in the substrate 102 respectively in the second electrode areas 102c.

The metal layer 110 is a copper layer, for example. The metal layer 110 is disposed on the substrate 102 and covers the first electrode areas 102a and the second electrode areas 102c, but does not cover the light receiving areas 102b.

In an embodiment, the first electrode areas 102a are anode areas, and the second electrode area 102c are cathode areas, for example. Specifically, the area connected to an N-type doped region is an anode area, and the area connected to a P-type doped region is a cathode area. Further, when the PN diode is operated in a reverse bias mode, a positive bias is applied to the N-type doped region and the P-type doped region is grounded; or a negative bias is applied to the P-type doped region and the N-type doped region is grounded In an embodiment, the metal layer 110 includes a plurality of metal lines 112 serving as anodes and a plurality of metal lines 114 serving as cathodes, as shown in FIGS. 2 and 3. The metal lines 112 respectively cover the first electrode areas 102a (anode areas), and the metal lines 114 respectively cover the second electrode areas 102c (cathode areas).

Figure 4A:
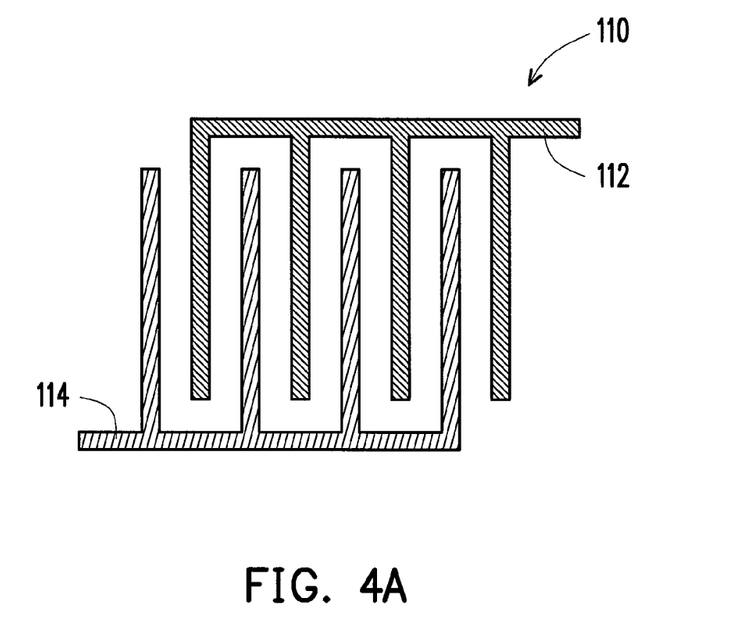
FIG. 4A schematically illustrates a top view of a metal layer of a lateral avalanche photodiode structure according to an embodiment of the present invention.

In an embodiment, ends of the first electrode areas 102a are not connected, and ends of the second electrode areas 102c are not connected. That is to say, each of the first electrode areas 102a, the light receiving areas 102b and the second electrode areas 102c has a stripe shape. Therefore, each of the well regions 104, the doped regions 106 and the metal lines 112 in the first electrode areas 102a has a stripe shape. Similarly, each of the doped regions 108 and the metal lines 114 in the second electrode areas 102c has a stripe shape. A plurality of lateral avalanche photodiode 100' each having a stripe shape is accordingly formed. It is noted that in the lateral APD structure 100 having such distribution of stripes, the metal lines 112 and the metal lines 114 are arranged alternately to form the metal layer 110 having an interdigital shape, as shown in the top view of FIG. 4A.

Figure 4B:
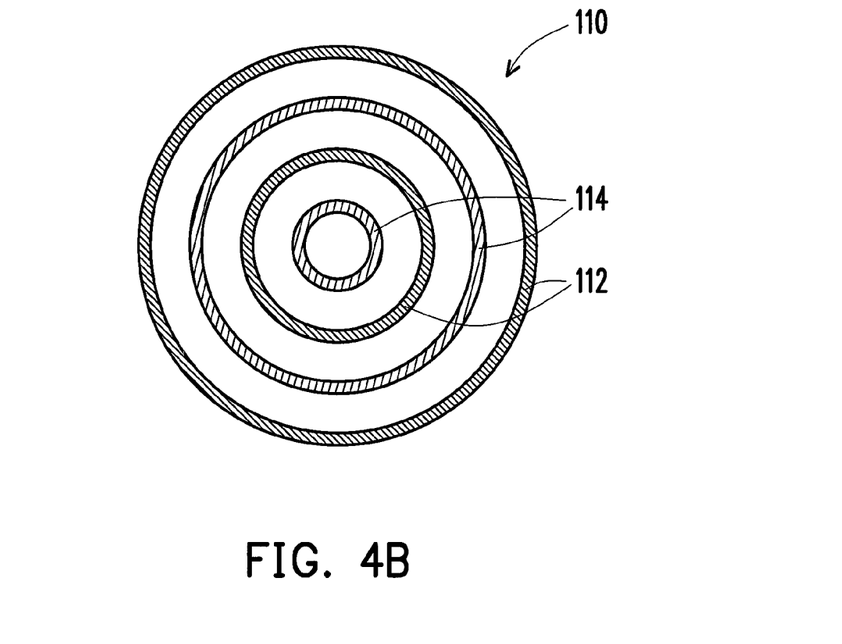
FIG. 4B schematically illustrates a top view of a metal layer of a lateral avalanche photodiode structure according to another embodiment of the present invention.

In another embodiment, ends of the first electrode areas 102a are connected, and ends of the second electrode areas 102c are connected. That is to say, the first electrode areas 102a, the light receiving areas 102b and the second electrode areas 102c are arranged in a surrounding distribution. Therefore, the well regions 104, the doped regions 106 and the metal lines 112 in the first electrode areas 102a are arranged in a surrounding distribution, such as a concentric circular distribution or a concentric polygonal distribution. Similarly, the doped regions 108 and the metal lines 114 in the second electrode areas 102c are arranged in a surrounding distribution. A plurality of lateral avalanche photodiode 100' each having a surrounding distribution is accordingly formed. It is noted that in the lateral APD structure 100 having such surrounding distribution, the metal lines 112 and the metal lines 114 are arranged alternately to form the metal layer 110 having a surrounding shape, as shown in the top view of FIG. 4B.

In the single lateral avalanche photodiode 100' of the first embodiment, a lateral structure of P⁺/P⁻/P/N⁺ including a P⁺ doped region 108, a P⁻ substrate 102, a P well region 104 and an N⁺ doped region 106 along the cutting line A-B is obtained. Further, the adjacent lateral avalanche photodiodes 100' are arranged symmetrically and share one avalanche area.

It is noted that in the lateral APD structure 100 of the present invention, the metal layer 110 is used to separate the avalanche areas (i.e. the first electrode areas 102a) from the light receiving areas 102b. The light receiving areas 102b responsible for generating electron-hole pairs are not covered by the metal layer 110, while the avalanche areas responsible for accelerating carriers are covered by the metal layer 110. Therefore, the light receiving areas 102b and the avalanche areas can function separately without disturbing each other, so as to improve the response speed and bandwidth to meet the customer's requirements.

Second Embodiment

Figure 5:
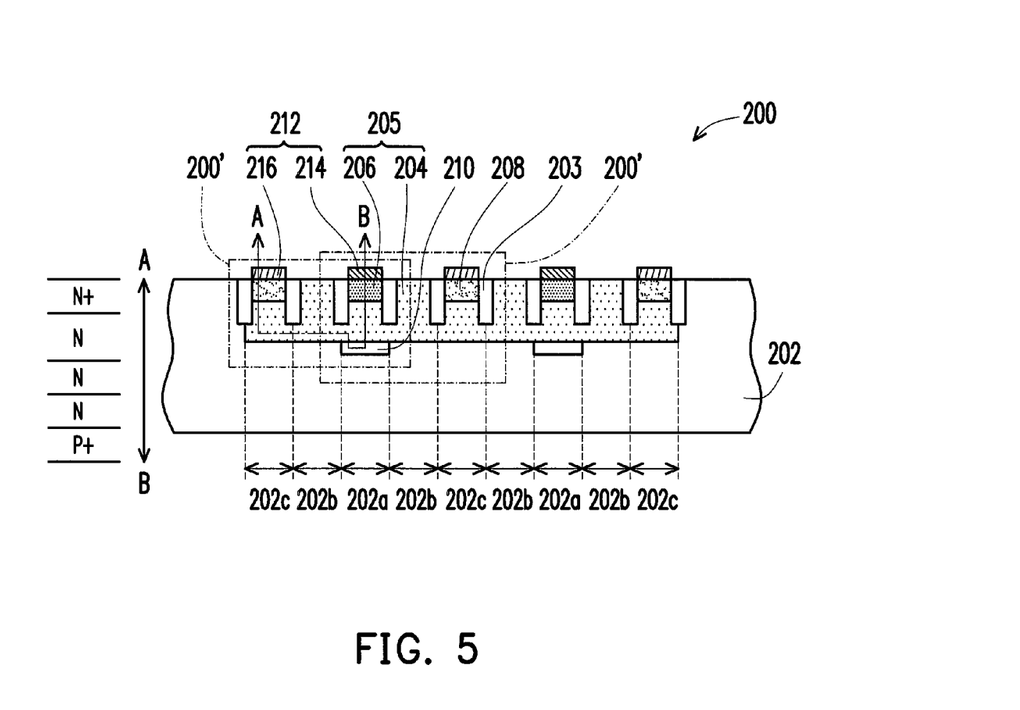
FIG. 5 schematically illustrates a cross-sectional view of a lateral avalanche photodiode structure according to a second embodiment of the present invention.

FIG. 5 schematically illustrates a cross-sectional view of a lateral avalanche photodiode structure according to a second embodiment of the present invention.

Referring to FIG. 5, a lateral APD structure 200 includes a substrate 202 of a first conductivity type, a plurality of isolation structures 203, a well region 204 of a second conductivity type, a plurality of doped regions 206 of the first conductivity type, a plurality of doped regions 208 of the second conductivity type, a plurality of deep well regions 210 of the second conductivity type and a metal layer 212.

The substrate 202 is a P-type lightly doped (P⁻) silicon substrate, for example. The substrate 202 has a plurality of first electrode areas 202a, a plurality of light receiving areas 202b and a plurality of second electrode areas 202c arranged horizontally. In an embodiment, the first electrode areas 202a are cathode areas, and the second electrode areas 202c are anode areas, for example. Further, the first electrode areas 202a are avalanche areas. The first electrode areas 202a and the second electrode areas 202c are arrange alternately, and a light receiving area 202b is disposed between a first electrode area 202a and an adjacent second electrode area 202c. The isolation structures 203 are STI structures, for example. The first electrode areas 202a, the light receiving areas 202b and the second electrodes areas 202c are separated from each other by the isolation structures 203.

The well region 204 is an N-type doped (N) well region, for example. The well region 104 is disposed in the substrate 202 in the first electrode areas 202c, the light receiving areas 202b and the second electrode areas 202c. The doped regions 206 are P-type heavily doped (P⁺) regions, for example. The doped regions 206 are disposed in the well region 204 respectively in the first electrode areas 202a. In each first electrode area 202a, the well region 204 and the doped region 206 forms a PN diode 205. The doped regions 208 are N-type heavily doped (N+) regions, for example. The doped regions 208 are disposed in the well region 204 respectively in the second electrode areas 202c.

The deep well regions 210 are N-type doped (N) deep well regions, for example. The deep well regions 210 are disposed in the substrate 202 respectively in the first electrode areas 202a and located below the well region 204. The function of the deep well regions 210 is to extend the electric field regions of the avalanche areas, so as to accelerate the carriers and strengthen the avalanche effect. It is noted that each deep well region 210 is an optional component, and the step of forming the deep well regions 210 can be omitted according to the process design.

The metal layer 212 is a copper layer, for example. The metal layer 210 is disposed on the substrate 202 and covers the first electrode areas 202a and the second electrode areas 202c, but does not cover the light receiving areas 202b. In an embodiment, the metal layer 212 includes a plurality of metal lines 214 serving as cathodes and a plurality of metal lines 216 serving as anodes, as shown in FIG. 5. The metal lines 214 respectively cover the first electrode areas 202a (cathode areas), and the metal lines 216 respectively cover the second electrode areas 202c (anode areas). Further, the metal layer 212 can has an interdigital shape or a surrounding distribution according to different arrangements of the lateral APD structure 200 of the second embodiment. The details have been described in the first embodiment and are not iterated herein.

In the single lateral avalanche photodiode 200' of the second embodiment, a lateral structure of N+/N/N/N/P+ including an N+ doped region 208, an N well region 204, an N deep well region 210, an N well region 204 and a P+ doped region 206 along the cutting line A-B is obtained. Further, the adjacent lateral avalanche photodiodes 200' are arranged symmetrically and share one avalanche area. Further, in the lateral APD structure 200, the metal layer 212 is used to separate the avalanche areas (i.e. first electrode areas 202a) from the light receiving areas 202b, so as to amplify the photocurrent and increase the responsivity.

Third Embodiment

Figure 6:
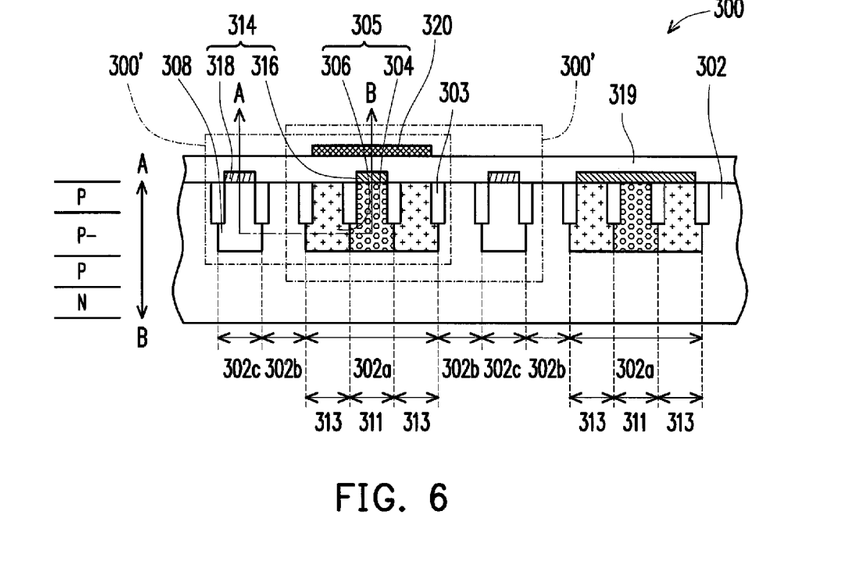
FIG. 6 schematically illustrates a cross-sectional view of a lateral avalanche photodiode structure according to a third embodiment of the present invention.

FIG. 6 schematically illustrates a cross-sectional view of a lateral avalanche photodiode structure according to a third embodiment of the present invention.

Referring to FIG. 6, a lateral APD structure 300 includes a substrate 302 of a first conductivity type, a plurality of isolation structures 303, a plurality of well regions 304 of a second conductivity type, a plurality of well regions 306 of the first conductivity type, a plurality of well regions 308 of the first conductivity type, a metal layer 314, an insulating layer 319 and the second metal layer 320.

The substrate 302 is a P-type lightly doped (P−) silicon substrate, for example. The substrate 302 has a plurality of first areas 302a, a plurality of light receiving areas 302b and a plurality of second areas 302c arranged horizontally. The first areas 302a and the second areas 302c are arrange alternately, and a light receiving area 302b is disposed between a first area 302a and an adjacent second area 302c. The first areas 302a are avalanche areas. Each of the first areas 302a includes a first electrode area 311 and two light shielding areas 313 beside the first electrode area 311, and each of the second areas 302c is a second electrode area. In an embodiment, the first electrode areas 311 are anode areas, and the second electrode areas (i.e. second areas 302c) are cathode areas, for example. The isolation structures 303 are STI structures, for example. The first areas 302a, the light receiving areas 302c and the second areas 302c are separated from each other by the isolation structures 303. Further, in each first area 302a, the first electrode area 311 and the light shielding areas 313 are separated from each other by the isolation structures 303.

The well regions 304 are N-type doped (N) well regions, for example. The well regions 304 are disposed in the substrate 302 respectively in the first electrode areas 311. The well regions 306 are P-type doped (P) well regions, for example. Two well regions 306 are disposed in the substrate 302 beside one first electrode area 311, and the well regions 306 are disposed beside the well region 304. In each first area 302a, the well region 304 and the well region 306 forms a PN diode 305. The well regions 308 are P-type doped (P) well regions, for example. The well regions 308 are disposed in the substrate 302 respectively in the second electrode areas (i.e. second areas 302c).

The first metal layer 314 is a copper layer, for example. The first metal layer 314 is disposed on the substrate 302 and covers the first electrode areas 311 and the second electrode areas (i.e. second areas 302c), but does not cover the light receiving areas 302b and the light shielding areas 313. In an embodiment, the first metal layer 314 includes a plurality of metal lines 316 serving as anodes and a plurality of metal lines 318 serving as cathodes, as shown in FIG. 6. The metal lines 316 respectively cover the first electrode areas 311 (anode areas), and the metal lines 318 respectively cover the second electrode areas 302c (cathode areas). Further, the metal layer 314 can have an interdigital shape or a surrounding distribution according to different arrangements of the lateral APD structure 300 of the third embodiment. The details have been described in the first embodiment and are not iterated herein.

The second metal layer 320 is a copper layer, for example. The second metal layer 320 is disposed on the first metal layer 314 and at least covers the light shielding areas 313, as shown in FIG. 6. In an embodiment, the second metal layer 320 covers the first electrode areas 311 and the light shielding areas 313 at the same time, as shown in FIG. 6. In another embodiment (not shown), the second metal layer 320 can be discontinuous and only covers the light shielding areas 313. Further, the insulating layer 319 is disposed between the first metal layer 314 and the second metal layer 320. The material of the insulating layer 319 is silicon oxide or silicon nitride, for example.

In the single lateral avalanche photodiode 300' of the third embodiment, a lateral structure of P/P−/P/N including a P well region 308, a P− substrate 302, a P well region 306 and an N well region 304 along the cutting line A-B is obtained. Further, the adjacent lateral avalanche photodiodes 300' are arranged symmetrically and share one avalanche area. Further, in the lateral APD structure 300, the first metal layer 314 and the second metal layer 320 are used to separate the avalanche areas (i.e. first areas 302a) from the light receiving areas 302b, so as to amplify the photocurrent and increase the responsivity.

Fourth Embodiment

Figure 7:
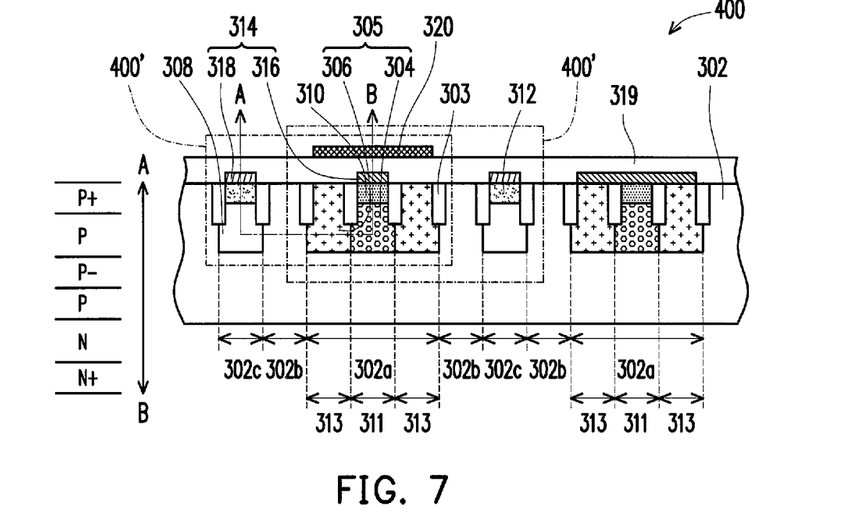
FIG. 7 schematically illustrates a cross-sectional view of a lateral avalanche photodiode structure according to a fourth embodiment of the present invention.

FIG. 7 schematically illustrates a cross-sectional view of a lateral avalanche photodiode structure according to a fourth embodiment of the present invention. The lateral APD structure 400 of the fourth embodiment is similar to the lateral APD structure 300 of the third embodiment. The difference between them is described in the following, and the similarity is not iterated herein.

Referring to FIG. 7, as compared with the lateral APD structure 300 of the third embodiment, the lateral APD structure 400 of the fourth embodiment further includes a plurality of doped regions 310 of the second conductivity type and a plurality of doped regions 312 of the first conductivity type. The doped regions 310 are N-type heavily doped (N$^+$) regions, for example. The doped regions 310 are respectively disposed in the well regions 304 in the first electrode areas 311. The doped regions 312 are P-type heavily doped (P$^+$) regions, for example. The doped regions 312 are respectively disposed in the well regions 308 in the second electrode areas (i.e. second areas 302c). The doped regions 310 and the doped regions 312 serve as the Ohmic contacts of the first electrode areas 311 and the second electrode areas 302c.

In the single lateral avalanche photodiode 400' of the fourth embodiment, a lateral structure of P$^+$/P/P$^-$/P/N/P$^+$ including a P$^+$ doped region 312, a P well region 308, a P$^-$ substrate 302, a P well region 306, an N well region 304 and an N$^+$ doped region 310 along the cutting line A-B is obtained. Further, the adjacent lateral avalanche photodiodes 400' are arranged symmetrically and share one avalanche area. Further, in the lateral APD structure 400, the first metal layer 314 and the second metal layer 320 are used to separate the avalanche areas (i.e. first areas 302a) from the light receiving areas 302b, so as to amplify the photocurrent and increase the responsivity.

The above-mentioned embodiments in which the first conductivity type is P-type and the second conductivity type is N-type are provided for illustration purposes, and are not construed as limiting the present invention. It is appreciated by persons skilled in the art that the first conductivity type can be N-type and the second conductivity type can be P-type.

An example and a comparative example are illustrated in the following to prove the performance of the present invention. The lateral APD structure 100 of the present invention in FIG. 2 is taken as an example. The conventional APD structure 10 in FIG. 1 is taken as a comparative example.

Figure 8:
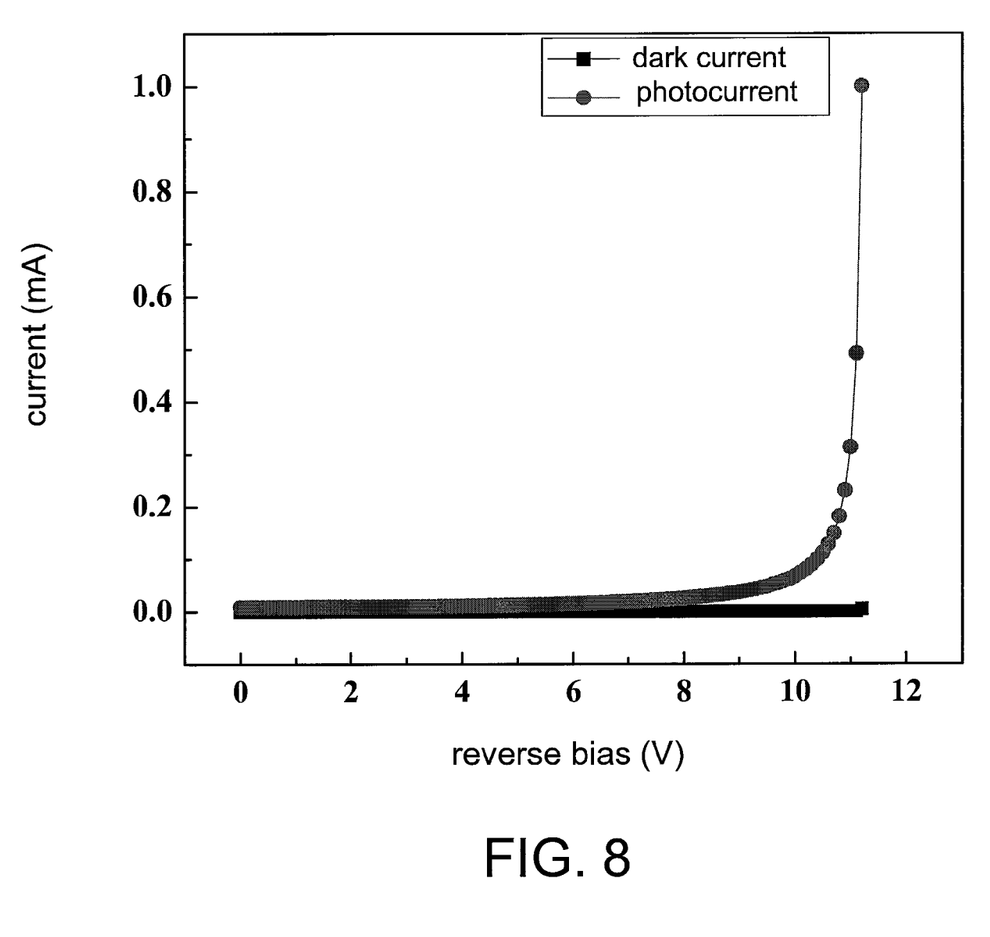
FIG. 8 is a diagram showing a relationship between current and reverse bias of a lateral avalanche photodiode structure of an example.
Figure 9:
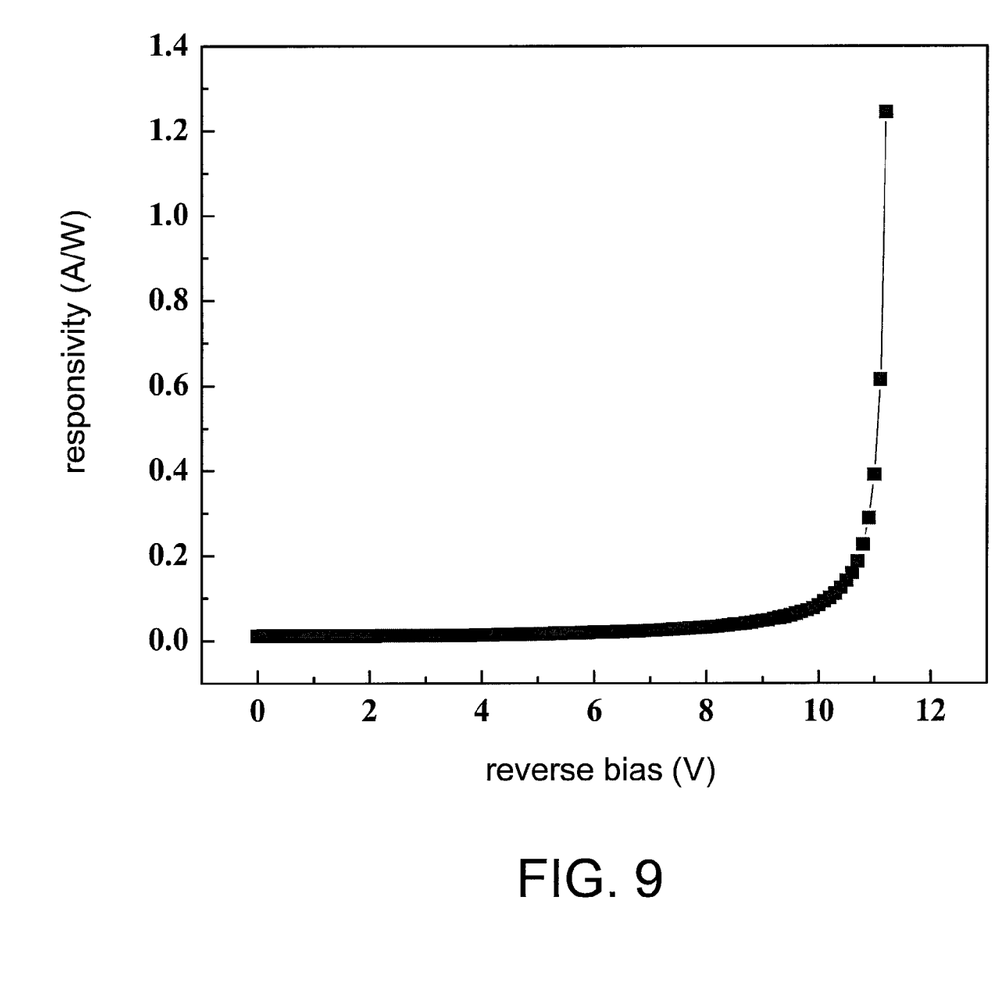
FIG. 9 is a diagram showing a relationship between responsivity and reverse bias of a lateral avalanche photodiode structure of an example.

FIG. 8 is a diagram showing a relationship between current and reverse voltage of a lateral avalanche photodiode structure of an example. FIG. 9 is a diagram showing a relationship between responsivity and reverse voltage of a lateral avalanche photodiode structure of an example. In the lateral APD structure of the example, the measurement result proves that when a small bias is applied, an avalanche breakdown does not occur, so that the generated current is small; while when a voltage around the breakdown voltage is applied, the avalanche breakdown occurs, so that the generated current including a photocurrent and a breakdown current is increased abruptly (as shown in FIG. 8), and the breakdown responsivity is greater than 1 A/W (as shown in FIG. 9).

Table 1 shows the testing results of the bandwidth and responsivity of the APD structures of the example and the comparative example.

The testing method of the bandwidth is to measure the 3-dB bandwidth point of the APD structure at the operation voltage near breakdown. First, an E/O calibration is performed with an optical network analyzer (ONA) for measuring the AC characteristic. Thereafter, the APD structure is adjusted to connect to a power supply via bias-tee. Afterwards, the input optical power and bias are changed so as to observe the corresponding bandwidth.

The testing method of the responsivity is described below. The APD structure is connected to a semiconductor device analyzer via bias-tee so as to observe the IV curve, photocurrent and dark current. The dark current near 1 μA is set as a breakdown point, and a power meter is used to measure a vertical-cavity surface-emitting laser (VCSEL). The responsivity is calculated from the output optical power of the VCSEL.

TABLE 1

|  | Example (structure of FIG. 2) | Comparative example (structure of FIG. 1) |
| --- | --- | --- |
| Bandwidth | 3.9 GHz | 1.6 GHz |
| Responsivity | 1.24 A/W | 0.74 A/W |
| Wavelength | 850 nm | 850 nm |

Referring to Table 1, the lateral APD structure of the present invention has higher bandwidth and responsivity at 850 nm than the conventional APD structure. Specifically, the bandwidth is increased by 144% from 1.6 GHz to 3.9 GHz, and the responsivity is increase by 68% from 0.74 A/W to 1.24 A/W. Thereafter, by separating the avalanche area from the light receiving area with the metal layer, the response speed and the bandwidth can be significantly improved, and the device performance can be effectively enhanced.

In summary, the present invention provides at least four lateral APD structures: the P$^+$/P$^-$/P/N$^+$ arrangement of the first embodiment, the N$^+$/N/N/N/P$^+$ arrangement of the second embodiment, the P/P$^-$/P/N arrangement of the third embodiment and the P$^+$/P/P$^-$/P/N/N$^+$ arrangement of the fourth embodiment. However, the present invention is not limited thereto. Any lateral APD structure can be designed according to the current commercial process as long as it meets the spirit of the present invention.

In other words, as stated in the first and second embodiments, the lateral APD structure of the present invention includes a substrate, a PN diode and a metal layer. The substrate has at least one first electrode area, at least one light receiving area and at least one second electrode area arranged horizontally, wherein the first electrode area is an avalanche area, and the light receiving area is disposed between the first electrode area and the second electrode area. The PN diode is disposed in the substrate in the first electrode area. The metal layer is disposed on the substrate and covers the first electrode area and the second electrode area but does not cover the light receiving area.

Alternatively, as stated in the third and fourth embodiments, the lateral avalanche photodiode structure of the present invention includes a substrate, a PN diode, a first metal layer, an insulating layer and a second metal layer. The substrate has at least one first area, at least one light receiving area and at least one second area arranged horizontally, wherein the light receiving area is disposed between the first area and the second area, and wherein the first area is an avalanche area, the first area includes a first electrode area and two light shielding areas beside the first electrode area, and the second area is a second electrode area. The PN diode is disposed in the substrate in the first area. The first metal layer is disposed on the substrate and only covers the first electrode area and the second electrode area. The second metal layer is disposed on the first metal layer and at least covers the light shielding areas. The insulating layer is disposed between the first metal layer and the second metal layer.

In the present invention, the metal layer is used to separate the avalanche area from the light receiving area, the irradiation region not covered with the metal layer is the APD light receiving area, and the PN junction area covered with the metal layer is the avalanche area with strong electric field. When light is irradiated to the light receiving area, electron-hole pairs are generated, and the avalanche effect of impact ionization is produced when drift carriers enter the strong electric field area. The lateral APD structure of the present invention has higher bandwidth and the responsivity of greater than 1 A/W at 850 nm and meets the customer's requirements.

Further, the lateral APD structure of the present invention is fabricated by a standard 0.18 μm CMOS process. That is to say, the structure of the present invention and a CMOS transistor can be completed simultaneously with a standard CMOS process, and additional process steps and specific postproduction are not required. Therefore, the process cost can be significantly saved, and the competitive advantage can be achieved. It is for sure that the standard CMOS process used in the present invention can be the new generation technique, and is not limited by a 0.18 μm CMOS process.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A lateral avalanche photodiode structure, comprising:
   a substrate of a first conductivity type, having at least one first electrode area, at least one light receiving area and at least one second electrode area arranged horizontally, wherein the first electrode area is an avalanche area, and the light receiving area is disposed between the first electrode area and the second electrode area;
   a PN diode, disposed in the substrate in the first electrode area; and
   a metal layer, disposed on the substrate and covering the first electrode area and the second electrode area but not covering the light receiving area.

2. The lateral avalanche photodiode structure of claim 1, further comprising a plurality of isolation structures disposed in the substrate, wherein the first electrode area, the light receiving area and the second electrode area are separated from each other by the isolation structures.

3. The lateral avalanche photodiode structure of claim 1, further comprising:
   a well region of the first conductivity type, disposed in the substrate in the first electrode area;
   a first doped region of a second conductivity type, disposed in the well region in the first electrode area, wherein the well region and the first doped region forms the PN diode; and
   a second doped region of the first conductivity type, disposed in the substrate in the second electrode.

4. The lateral avalanche photodiode structure of claim 3, wherein the first conductivity type is P-type and the second conductivity type is N-type, or the first conductivity type is N-type and the second conductivity type is P-type.

5. The lateral avalanche photodiode structure of claim 1, further comprising:
   a well region of a second conductivity type, disposed in the substrate in the first electrode area, the light receiving area and the second electrode area;
   a first doped region of the first conductivity type, disposed in the well region in the first electrode area, wherein the well region and the first doped region forms the PN diode; and
   a second doped region of the second conductivity type, disposed in the well region in the second electrode.

6. The lateral avalanche photodiode structure of claim 5, further comprising:
   a deep well region of the second conductivity type, disposed in the substrate in the first electrode area and located below the well region.

7. The lateral avalanche photodiode structure of claim 5, wherein the first conductivity type is P-type and the second conductivity type is N-type, or the first conductivity type is N-type and the second conductivity type is P-type.

8. The lateral avalanche photodiode structure of claim 1, wherein a material of the substrate comprises silicon.

9. The lateral avalanche photodiode structure of claim 1, wherein a material of the metal layer comprises copper.

10. The lateral avalanche photodiode structure of claim 1, wherein the substrate comprises a plurality of first electrode areas, a plurality of light receiving areas and a plurality of second electrode areas, the first electrode areas and the second electrode areas are arranged alternately, and a light receiving area is disposed between a first electrode area and an adjacent second electrode area.

11. The lateral avalanche photodiode structure of claim 10, wherein ends of the first electrode areas are not connected, and ends of the second electrode areas are not connected, so as to form a plurality of lateral avalanche photodiode structures each having a stripe shape.

12. The lateral avalanche photodiode structure of claim 10, wherein ends of the first electrode areas are connected, and ends of the second electrode areas are connected, so as to form a plurality of lateral avalanche photodiode structures each having a surrounding distribution.

13. A lateral avalanche photodiode structure, comprising:
   a substrate of a first conductivity type, having at least one first area, at least one light receiving area and at least one second area arranged horizontally, wherein the light receiving area is disposed between the first area and the second area, and wherein the first area is an avalanche area, the first area comprises a first electrode area and two light shielding areas beside the first electrode area, and the second area is a second electrode area;
   a PN diode, disposed in the substrate in the first area; and
   a first metal layer, disposed on the substrate and only covering the first electrode area and the second electrode area;
   a second metal layer, disposed on the first metal layer and at least covering the light shielding areas; and
   an insulating layer, disposed between the first metal layer and the second metal layer.

14. The lateral avalanche photodiode structure of claim 13, further comprising:
   a first well region of a second conductivity type, disposed in the substrate in the first electrode area;
   two second well regions of the first conductivity type, disposed in the substrate respectively in the light shielding areas, wherein the first well region and the second well region forms the PN diode; and
   a third well region of the first conductivity type, disposed in the substrate in the second electrode area.

15. The lateral avalanche photodiode structure of claim 14, further comprising:
   a first doped region of the second conductivity type, disposed in the first well region in the first electrode area; and
   a second doped region of the first conductivity type, disposed in the third well region in the second electrode area.

16. The lateral avalanche photodiode structure of claim 13, wherein the first conductivity type is P-type and the second conductivity type is N-type, or the first conductivity type is N-type and the second conductivity type is P-type.

17. The lateral avalanche photodiode structure of claim 13, wherein a material of the substrate comprises silicon.

18. The lateral avalanche photodiode structure of claim 13, wherein a material of the first metal layer and the second metal layer comprises copper.

19. The lateral avalanche photodiode structure of claim 13, wherein the substrate comprises a plurality of first areas, a plurality of light receiving areas and a plurality of second areas, the first areas and the second areas are arranged alternately, and a light receiving area is disposed between a first area and an adjacent second area.

20. The lateral avalanche photodiode structure of claim 19, wherein ends of the first areas are not connected, and ends of the second areas are not connected, so as to form a plurality of lateral avalanche photodiode structures each having a stripe shape.

21. The lateral avalanche photodiode structure of claim 19, wherein ends of the first areas are connected, and ends of the second areas are connected, so as to form a plurality of lateral avalanche photodiode structures each having a surrounding distribution.

\* \* \* \* \*